(12) United States Patent
Amini et al.

(10) Patent No.: US 6,994,563 B2
(45) Date of Patent: Feb. 7, 2006

(54) SIGNAL CHANNEL CONFIGURATION PROVIDING INCREASED CAPACITANCE AT A CARD EDGE CONNECTION

(75) Inventors: Kamran Amini, Cary, NC (US); Joseph Curtis Diepenbrock, Raleigh, NC (US); Robert Joseph Evans, Cary, NC (US); Michael Leo Scollard, Raleigh, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 10/742,437

(22) Filed: Dec. 19, 2003

(65) Prior Publication Data

US 2005/0136699 A1    Jun. 23, 2005

(51) Int. Cl.
*H01R 12/20* (2006.01)

(52) U.S. Cl. .......................... 439/62; 439/951; 361/777
(58) Field of Classification Search ................. 439/55, 439/59–65, 637, 951; 174/261, 268; 361/777; 333/33, 34
See application file for complete search history.

(56) References Cited

U.S. PATENT DOCUMENTS

| | | | |
|---|---|---|---|
| 3,651,432 A * | 3/1972 | Henschen et al. ............ 333/33 |
| 3,818,117 A * | 6/1974 | Reyner et al. ................ 174/36 |
| 5,024,609 A * | 6/1991 | Piorunneck ................ 439/637 |
| 5,061,190 A | 10/1991 | Medeiors et al. |
| 5,259,768 A | 11/1993 | Brunker et al. |
| 5,676,559 A * | 10/1997 | Laub et al. ................. 439/260 |
| 5,764,489 A * | 6/1998 | Leigh et al. ................ 361/777 |
| 6,234,807 B1 | 5/2001 | Amini et al. |
| 6,254,435 B1 * | 7/2001 | Cheong et al. ............. 439/637 |
| 6,425,766 B1 | 7/2002 | Panella |
| 6,759,917 B2 * | 7/2004 | Ikurumi et al. ............ 333/17.3 |
| 6,784,526 B1 * | 8/2004 | Mezawa ..................... 257/679 |

* cited by examiner

*Primary Examiner*—Gary Paumen
(74) *Attorney, Agent, or Firm*—Ron Davidge; Carlos Munoz-Bustamante

(57) ABSTRACT

A signal channel extends from motherboard to a daughter card across an edge connection. The daughter card includes a conductive plane that is held at a constant electrical potential. In order to compensate for a number of sources of inductance within the signal line at the edge connection, a circuit trace forming a portion of the signal channel includes an enlarged portion, spaced inward along the daughter card from the contact pads forming the edge connection, that adds capacitive coupling of the signal channel with the conductive plane.

7 Claims, 1 Drawing Sheet

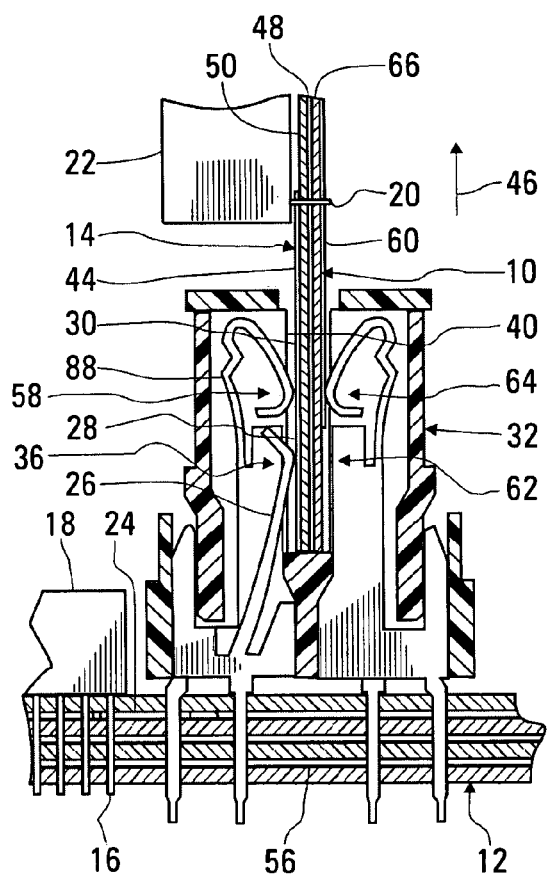
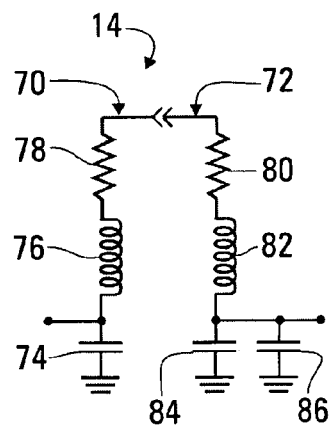
FIG. 3
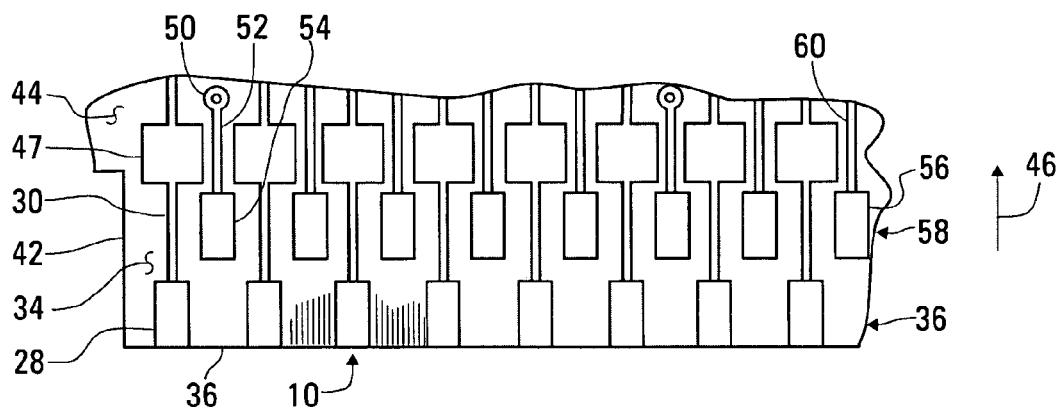
FIG. 1
FIG. 2

SIGNAL CHANNEL CONFIGURATION PROVIDING INCREASED CAPACITANCE AT A CARD EDGE CONNECTION

BACKGROUND OF THE INVENTION

1. Field of the Invention

This invention relates to a signal channel extending between an electronic device on a motherboard and an electronic device on a daughter card through a card edge connection, and, more particularly to a signal channel configuration having increased capacitance to electrical ground at the card edge connection to compensate for inductance introduced within a contact terminal forming part of the signal channel.

2. Description of the Related Art

Electrical connections are typically made between a motherboard and a daughter card through a card edge connection, with a number of contact pads extending in one or more rows along the edge of the daughter card being electrically connected to a similar number of contact terminals within a connector attached to the motherboard. It is often difficult to achieve a proper impedance for the a high-speed signal channel extending through such a connection because of the local inductance contributed by the contact terminal within the connector and because of the additional impedance associated with circuit traces adjacent the connector. When effective compensation is not applied for these sources of inductance, discontinuities in the line impedance of the channel cause reflections that degrade signal quality.

A conventional method for tuning the impedance of a signal channel is through the addition of a discrete component, such as a capacitor connected between the signal channel and electrical ground. What is needed is a method eliminating the additional cost and physical space on a circuit card required to provide for an additional discrete component.

U.S. Pat. No. 6,425,766 describes a connector system including a circuit card and method of manufacturing the circuit card. By way of example, the system includes a connector having an elongated housing with an elongated cardreceiving slot. A plurality of signal terminals and ground terminals are mounted on the housing along the slot and have contact sections extending into the slot. A circuit card has an edge insertable into the slot, a ground plane facing a surface of the card at least near the edge and a plurality of signal contact pads and a plurality of ground contact pads along the edge for engaging the contact sections of the signal terminals and the ground terminals, respectively. The size or area of the signal contact pads is varied relative to the ground contact pads to vary the capacitance in the area of the terminaltocircuit card interface and, thereby, vary the impedance of the system. What is needed is a system in which the impedance of the signal channels can be tuned without requiring that individual ground contact pads must be placed next to the individual signal pads for which the impedance is being tuned.

Methods for compensating for sources of inductance at an edge card connection include modifying the connector to be attached to the motherboard, as described, for example in U.S. Pat. No. 5,259,768, which describes a connector including body portions having mechanically nonfunctional sections of a given area, which effect a given capacitance. The mechanically nonfunctional sections are selectively trimmable to selectively vary the area thereof and thereby vary the capacitance of the terminals and, therefore, the impedance of the connector to match the given impedance of the electrical circuit. The connector includes a plurality of signal terminals and a plurality of ground terminals. The ground terminals have at least two points of contact for engaging a common ground circuit on the printed circuit board for reducing the inductance between a particular ground terminal and its respective circuit trace. What is needed is a method for modifying the circuit traces of the daughter card to eliminate the costs associated with making such specific modifications to the connector.

Other examples of card edge connections including double rows of contact pads are found in U.S. Pat. Nos. 5,061,190 and 6,234,807. What is needed is a way to provide such a card edge connection with simple and effective tuning of signal channel impedance.

SUMMARY OF THE INVENTION

In accordance with one aspect of the invention, a signal channel extending between a first device on a motherboard and a second device on a daughter card is provided. The signal channel includes a first circuit trace extending along the motherboard, a contact terminal within a connector attached to the motherboard, a first contact pad on a surface of the daughter card, and a second circuit trace extending along the daughter card. The first circuit trace is electrically connected to a terminal of the first device, while the second circuit trace is electrically connected to a terminal of the second device and to the first contact pad. The first contact pad is located on a surface of an edge tab of the daughter card, wherein the edge tab is held within the connector with the contact pad in contact with the contact terminal. The second circuit trace includes an enlarged section at a location spaced apart from the contact pad along the second circuit trace and spaced apart from the second device along the second circuit trace. The enlarged section extends along the surface of the daughter card, spaced away from an adjacent portion of a conductive plane of the daughter card by dielectric material of the daughter card. The conductive plane of the daughter card is held at a constant electrical potential.

In accordance with another aspect of the invention, a daughter card is provided, with the daughter card including an edge portion insertable into a connector on a motherboard, a first row of contact pads, a number of circuit traces, a conductive plane, a dielectric sheet, means for connecting the conductive plane to a fixed electric potential, and at least one device including device terminals through which electrical signals are driven. The first row of contact pads extends along a first side of the edge portion. Each of the first circuit traces extends from an electrical connection at one of the contact pads in the first row to an electrical connection at one of the device terminals. Each of the first circuit traces includes a first enlarged section a location spaced apart along the first circuit trace from the contact pad from which the first circuit trace extends and from the device terminal to which the first circuit trace extends. The conductive plane extends adjacent the enlarged section of each of the first circuit traces. The dielectric sheet extends as a part of the daughter card between the conductive plane and each of the first circuit traces.

Preferably, the daughter card additionally includes a second row of contact pads extending along the first side of the edge portion. Such a second row of contact pads is located inwardly along the surface of the edge portion of the daughter card from the first row of contact pads. Individual circuit traces among the first circuit traces extend inward from the contact pads in the first row between adjacent contact pads in the second row. The first enlarged section of each of the first circuit traces is located inwardly from the second row of contact pads.

BRIEF DESCRIPTION OF THE FIGURES

FIG. 1 is a fragmentary transverse cross-sectional view of a daughter card made in accordance with the invention connected to a motherboard to provide a number of signal channels configured in accordance with the invention;

FIG. 2 is a fragmentary elevation of the daughter card of FIG. 1; and

FIG. 3 is a schematic view of the signal channel of FIG. 1.

DETAILED DESCRIPTION OF THE INVENTION

FIG. 1 is a fragmentary cross-sectional view of a daughter card 10, made in accordance with the invention, connected to a motherboard 12 to provide a number of signal channels 14 configured in accordance with the invention. Each of the signal channels 14 extends between a terminal 16 of a first device 18 on the motherboard 12 and a terminal 20 of a second device 22 on the daughter card 10. The signal channel 14 includes a board circuit trace 24, extending along the motherboard 12 between the terminal 16 of the first device 18, a first contact terminal 26, electrically connected to the board circuit trace 24, a first contact pad 28, contacted by the first contact terminal 26, and a first card circuit trace 30, extending along the daughter card 10 to an electrical connection with the terminal 20 of the second device 22. The first contact terminal 26 forms a part of a connector 32 attached to the motherboard 12. The devices 18, 22 are understood to be electronic devices that generate and/or use electrical signals driven through the device terminals 16, 20. A circuit trace is understood to be a conductive pattern extending along and/or within a circuit board, such as the motherboard 12 or the daughter card 10.

FIG. 2 is a fragmentary elevation of the daughter card 10, showing an edge portion 34 including a number of first contact pads 28, from which first card circuit traces 30 extend. Each of the first contact pads 28 is characterized by its location within a first row 36 extending along an edge 38 of the edge portion 34. The edge portion 34 is configured for insertion into a slot 40 of the connector 32 in a manner locating each of the first contact pads 28 in alignment with a corresponding first contact terminal 26. For example, the edge portion 34 may extend between a pair of end surfaces 42, one of which is shown in FIG. 2, that are spaced to fit within the connector 32 with a minimum of clearance. Each of the first card circuit traces 30 extends along the first surface 44 of the daughter card 10 in an inward direction, as indicated by arrow 46, from a corresponding one of the first contact pads 28. The first contact pad 28 may be formed by plating a material, such as gold, having a suitably low electrical contact resistance and a suitably high corrosion resistance, over an end portion of the first card circuit trace 30.

In accordance with the invention, each of the first circuit traces 30 includes an enlarged portion 47, disposed at a position along the first circuit trace 30 so that the enlarged portion is spaced away from both the first contact pad 28 and the terminal 20 of the second device 22. Preferably, the enlarged portion 47 is rectangular in shape.

The daughter card 10 additionally includes a conductive plane 48 extending under the enlarged portions 47 of the first circuit traces 30, being separated from the first circuit traces 30 by a dielectric sheet 50 forming a portion of the daughter card 10. As shown in the example of FIG. 11 the conductive plane 48 may be an internal plane within the daughter card 10. The daughter card 10 additionally includes means for connecting the conductive plane 48 to a constant electrical potential. For example, the conductive plane 48 is connected by one or more conductive vias 50 to card grounding circuit traces 52 electrically connected to grounding circuit pads 54. When the daughter card 10 is inserted into the connector 32, the grounding circuit pads 54 are electrically connected to a ground plane 56 within the motherboard 12 by grounding terminals 58 within the connector 32. The ground plane 56 is in turn connected to electrical ground through a ground wire from a power supply or through attachment to an electrically grounded frame or chassis member. Alternately, the conductive plane 48 may be connected to electrical ground through a separate connector or through the attachment of a conductive wire or clip to the daughter card 10. The conductive plane 48 may alternately be connected to another fixed electrical potential, such as one of the voltages provided by a power supply driving various components on the motherboard 12 and the daughter card 10.

As shown in FIG. 2, the daughter card 10 may additionally include a number of second contact pads 56, arranged in a second row 58 to be inwardly disposed, in the direction of arrow 46, from the first contact pads 28. Each of the second contact pads 56 is electrically connected to a second card circuit trace 60. Various of the first card circuit traces 30 extend inward, in the direction of arrow 46 between adjacent second contact pads 56. The second contact pads 56 provide additional electrical connections to the daughter card, including, for example, the electrical grounding connections made to the conductive plane 48 from the contact pads 54, which form a certain of the contact pads 58.

The preceding discussion has described a first row 36 of first contact pads 28 and a second row 58 of contact pads 56, all of which are located on a first side 44 of the daughter card 10. The opposite side 60 of the daughter card 10 may have a third row 62 of contact pads with associated third card circuit traces that are similar to the first row 36 of first card contact pads 28 with associated first card circuit traces 30. The opposite side 60 of the daughter card 10 may further have a fourth row 64 of contact pads with associated fourth card circuit traces that are similar to the second row 58 of second contact pads 56 with associated second card circuit traces 60. The third card circuit traces then preferably include enlarged portions similar to the enlarged portions 47, which are separated from the conductive plane 48 by a dielectric sheet 66.

If enlarged portions, such as the enlarged portions 47, are present on both sides of the daughter card 10, it is not necessary that they be adjacent the same conductive plane. The daughter card 10 may include a number of internal conductive planes.

FIG. 3 is a schematic view of the signal channel 14, showing equivalent inductive elements thereof. The signal channel 14 includes a first portion 70 including elements attached to the motherboard 12 and a second portion 72 including elements attached to the daughter card 10. The first portion 70 includes a capacitance 74 to electrical ground, mainly due to capacitance between the circuit trace 24 and the ground plane 56 within the motherboard 12. The first portion 10 further includes an inductance 76 and a resistance 78, formed by combining these properties of the circuit trace 24 and the contact terminal 26. Within the daughter card 10, the second portion 72 includes a resistance 80 and an inductance 82, contributed mainly by the first card channel 30 and a first capacitance 84 to electrical ground, arising from the capacitance between the first channel 30, together with the first contact pad 28 and the conductive plane 48 within the daughter card 10. The second portion 72 also includes a second capacitance 86 arising from the capacitance between the enlarged section 47 and the conductive plane 48. The impedance contributed by the inductance 82, the capacitance 84, and the capacitance 86 is given by the square root of the ratio of the inductance 82 to the total capacitance 84 and 86, with an improvement in the impedance being achieved through increasing the capacitance with the enlarged section 47.

The invention has been applied, for example, to a channel driving computer memory on a daughter card. In this example, the capacitance 74 to ground on the motherboard was determined to be 1.10 pF, while the resistance 78 was determined to be 0.010 ohm. The inductance 76 was 0.83 nH or 1.95 nH, depending on the type of connector being used. On the daughter card, the resistance 80 was determined to be 0.010 ohm, and the inductance 82 was determined to be 0.5 nH. The capacitance 84 to electrical ground without the enlarged portion 47 was determined to be 2.5 pF, while the capacitance 86 to ground contributed by the enlarged portion 47 was determined to be 2.0 pF. Thus, a significant increase in capacitance of the channel and the card edge connection was achieved without significant expense and without using much additional area on the daughter card.

While the example of FIG. 1 shows a pair to devices 18, 22 soldered to circuit boards by pin terminals, this is shown only as an example, which is not meant to be limiting. A number of such separate devices may be connected by a number of signal channels.

While the invention has been described in its preferred version with some degree of particularity, it is understood that this description has only been given by way of example, and that many variations can be made without departing from the spirit and scope of the invention, as defined by the appended claims.

What is claimed is:

1. A daughter card comprising:
    an edge portion insertable into a connector on a motherboard;
    a first row of contact pads extending along a first side of the edge portion;
    at least one device including device terminals through which electrical signals are driven;
    a plurality of first circuit traces, wherein each of the first circuit traces extends from an electrical connection at one of the contact pads in the first row to an electrical connection at one of the device terminals, wherein each of the first circuit traces includes a first enlarged section disposed at a location spaced apart along the first circuit trace from the contact pad from which the first circuit trace extends and from the device terminal to which the first circuit trace extends;
    a conductive plane extending adjacent the enlarged section of each of the first circuit traces;
    a dielectric sheet extending as a part of the daughter card between the conductive plane and each of the first circuit traces;
    means for connecting the conductive plane to a fixed electrical potential; and,
    a second row of contact pads extending along the first side of the edge portion, wherein the second row of contacts pad is disposed inwardly from the first row of contact pads, wherein individual circuit traces within the first circuit traces extend inward from the contact pads in the first row between adjacent contact pads inenlarged section of each of the first circuit traces is disposed inwardly from the second row of contact pads.

2. The daughter card of claim 1, wherein the first enlarged section is rectangular in shape, extending in equal distances from opposite sides of a portion of the first circuit trace extending between the contact pad from which the first circuit trace extends and the enlarged section.

3. The daughter card of claim 1, additionally comprising a plurality of second circuit traces extending inward between the first enlarged sections of adjacent first circuit traces.

4. The daughter card of claim 1, additionally comprising:
    a third row of contact pads extending along a second side of the edge portion, opposite the first side;
    a plurality of third circuit traces, wherein each of the third circuit traces extends from an electrical connection at one of the contact pads in the third row to an electrical connection at one of the device terminals, wherein each of the third circuit traces includes a second enlarged section disposed at a location spaced apart along the third circuit trace from the contact pad from which the third circuit trace extends and from the device terminal to which the third circuit trace extends; and
    a dielectric sheet extending as a part of the daughter card between the conductive plane and each of the third circuit traces.

5. The daughter card of claim 4, additionally comprising a fourth row of contact pads extending along the second side of the edge portion, wherein
    the fourth row of contact pads is disposed inwardly from the third row of contact pads,
    individual circuit traces within the third circuit traces extend inward from the contact pads in the third row between adjacent contact pads in the fourth row, and
    the second enlarged section of each of the first circuit traces is disposed inwardly from the fourth row of contact pads.

6. The daughter card of claim 5, wherein
    the first enlarged section is rectangular in shape, extending in equal distances from opposite sides of a portion of the first circuit trace extending between the from the first contact pad from which the first circuit trace extends and the second enlarged section, and
    the second enlarged section is rectangular in shape, extending in equal distances from opposite sides of a portion of the third circuit trace extending between the third contact pad from which the third circuit trace extends and the third enlarged section.

7. The daughter card of claim 6, additionally comprising:
    a plurality of second circuit traces extending inward between the first enlarged sections of adjacent first circuit traces; and
    a plurality of fourth circuit traces extending inward between the second enlarged sections of adjacent third circuit traces.

* * * * *